US010660238B2

(12) United States Patent
Durgin

(10) Patent No.: US 10,660,238 B2
(45) Date of Patent: May 19, 2020

(54) ELECTRICALLY INSULATING THERMAL CONNECTOR HAVING A LOW THERMAL RESISTIVITY

(71) Applicant: AVX Corporation, Fountain Inn, SC (US)

(72) Inventor: Scott B. Durgin, Jasksonville, FL (US)

(73) Assignee: AVX Corporation, Fountain Inn, SC (US)

( * ) Notice: Subject to any disclaimer, the term of this patent is extended or adjusted under 35 U.S.C. 154(b) by 0 days.

(21) Appl. No.: 16/135,303

(22) Filed: Sep. 19, 2018

(65) Prior Publication Data

US 2019/0090381 A1 Mar. 21, 2019

Related U.S. Application Data

(60) Provisional application No. 62/561,408, filed on Sep. 21, 2017.

(51) Int. Cl.
*H05K 1/02* (2006.01)
*H05K 1/11* (2006.01)
(Continued)

(52) U.S. Cl.
CPC ............ *H05K 7/205* (2013.01); *H01L 23/36* (2013.01); *H05K 1/0204* (2013.01);
(Continued)

(58) Field of Classification Search
CPC .... H01L 23/36; H05K 1/0204; H05K 1/0209; H05K 1/115; H05K 1/02; H05K 1/11; H05K 7/205; H05K 7/20; H05K 2201/066
(Continued)

(56) References Cited

U.S. PATENT DOCUMENTS 5,262,834 A * 11/1993 Kusaka .............. G03G 15/2003 219/216
5,698,896 A 12/1997 Komatsu et al.
(Continued)

FOREIGN PATENT DOCUMENTS

CN 106058124 A * 10/2016 ........ H01M 10/4235
JP 2004039691 A 2/2004
JP 2010245563 A 10/2010

OTHER PUBLICATIONS

ATC Q-Bridge Thermal Conductor_Feb. 2015_pp. 1-2.*
(Continued)

*Primary Examiner* — Timothy J Thompson
*Assistant Examiner* — Guillermo J Egoavil
(74) *Attorney, Agent, or Firm* — Dority & Manning, P.A.

(57) ABSTRACT

A thermal connector comprising an electrically insulating beam having a first end face at a first end and a second end face at a second end is provided. The second end face may be opposite the first end face in an X direction. The beam may have a width in a Y direction perpendicular to the X direction. The beam may also have a top face and a bottom face offset from the top face in a Z direction. The thermal connector may include a first terminal attached to the bottom face and adjacent the first end and a second terminal attached to the top face and adjacent the first end. The connector may have an overall thickness in the Z direction, which includes the first and second terminals and is greater than 1.27 mm and less than 3.81 mm.

21 Claims, 9 Drawing Sheets

(51) Int. Cl.
*H05K 7/20* (2006.01)
*H01L 23/36* (2006.01)

(52) U.S. Cl.
CPC .......... *H05K 1/0209* (2013.01); *H05K 1/115* (2013.01); *H05K 2201/066* (2013.01)

(58) Field of Classification Search
USPC .......................................... 174/252; 257/99
See application file for complete search history.

(56) References Cited

U.S. PATENT DOCUMENTS

| | | | | |
|---|---|---|---|---|
| 5,787,976 | A | 8/1998 | Hamburgen et al. | |
| 6,762,395 | B2 | 7/2004 | Yagnik et al. | |
| 8,803,183 | B2 | 8/2014 | Chang et al. | |
| 9,634,214 | B2 | 4/2017 | Yan | |
| 9,839,159 | B1* | 12/2017 | Banijamali | H01L 21/563 |
| 9,874,316 | B2 | 1/2018 | Yu et al. | |
| 2005/0168941 | A1 | 8/2005 | Soko et al. | |
| 2013/0058695 | A1* | 3/2013 | Jensen | H05K 7/20436 400/76 |
| 2014/0124822 | A1* | 5/2014 | Yan | H01L 33/641 257/99 |
| 2014/0254336 | A1* | 9/2014 | Jandric | G02B 6/1226 369/13.33 |
| 2014/0335398 | A1* | 11/2014 | Partin | H01M 2/1094 429/156 |

OTHER PUBLICATIONS

IMS-Product_Catalog_Oct. 2015_pp. 1-20.*
Therma-Bridge by IMS B-Series ver 9. 6_Jun. 2012_pp. 1-2.*
Therma-Bridge by IMS ver B-Series_Sep. 2016_pp. 1-2.*
Therma-Plane by IMS ver A-series_Apr. 2016_pp. 1-2.*
Product Inforination—ATC's Q-Bridge Thermal Conductor from American Technical Ceramics, 1 page.
Product Information—ATC Q-Bridge Thermal Conductor from American Technical Ceramics dated Mar. 2015, 2 pages.
Product Information—ATC Q-Bridge Thermal Conductor from American Technical Ceramics dated Jul. 2015, 2 pages.
Product Information—ATC Q-Bridge Thermal Conductor from American Technical Ceramics dated Feb. 2016, 2 pages.
Product Information—ATC Q-Bridge Thermal Conductor from American Technical Ceramics dated May 2017, 2 pages.
Product Information—Therma-Bridge™ from International Manufacturing Services, Inc. dated Sep. 2016, 2 pages.

* cited by examiner

ELECTRICALLY INSULATING THERMAL CONNECTOR HAVING A LOW THERMAL RESISTIVITY

CROSS REFERENCE TO RELATED APPLICATION

The present application claims filing benefit of U.S. Provisional Patent Application Ser. No. 62/561,408 having a filing date of Sep. 21, 2017, which is incorporated herein by reference in its entirety.

BACKGROUND OF THE INVENTION

Electrical circuits, such as power amplifier circuits, generate heat during normal operation. Heat build-up may undesirably increase the temperature of the various components of the electrical circuit. If this heat is not sufficiently managed, for example by dissipation to a heat sink, the electrical device may overheat, resulting in damage to the electrical component. Connecting an electrical component directly to the heat sink, however, may undesirably create an electrical connection between the electrical component and the heat sink, i.e., a flow of electrical current, and disrupt the operation of the electrical component and circuit. As such, a need currently exists for a thermal connector having a low thermal resistance and a high electrical resistance.

SUMMARY OF THE INVENTION

In accordance with one embodiment of the present invention, a thermal connector is disclosed. The thermal connector may include an electrically insulating beam having a first end face at a first end and a second end face at a second end. The second end face may be opposite the first end face in an X direction. The beam may have a width in a Y direction which is perpendicular to the X direction. The beam may also have a top face and a bottom face offset from the top face in a Z direction, which is perpendicular to each of the X and Y directions. The thermal connector may include a first terminal attached to the bottom face and adjacent the first end and a second terminal attached to the top face and adjacent the first end. The connector may have an overall thickness in the Z direction, which includes the first and second terminals. The overall thickness may be greater than 0.05 inch (1.27 mm) and less than 0.15 inch (3.81 mm).

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figure in which.

Figure 1:
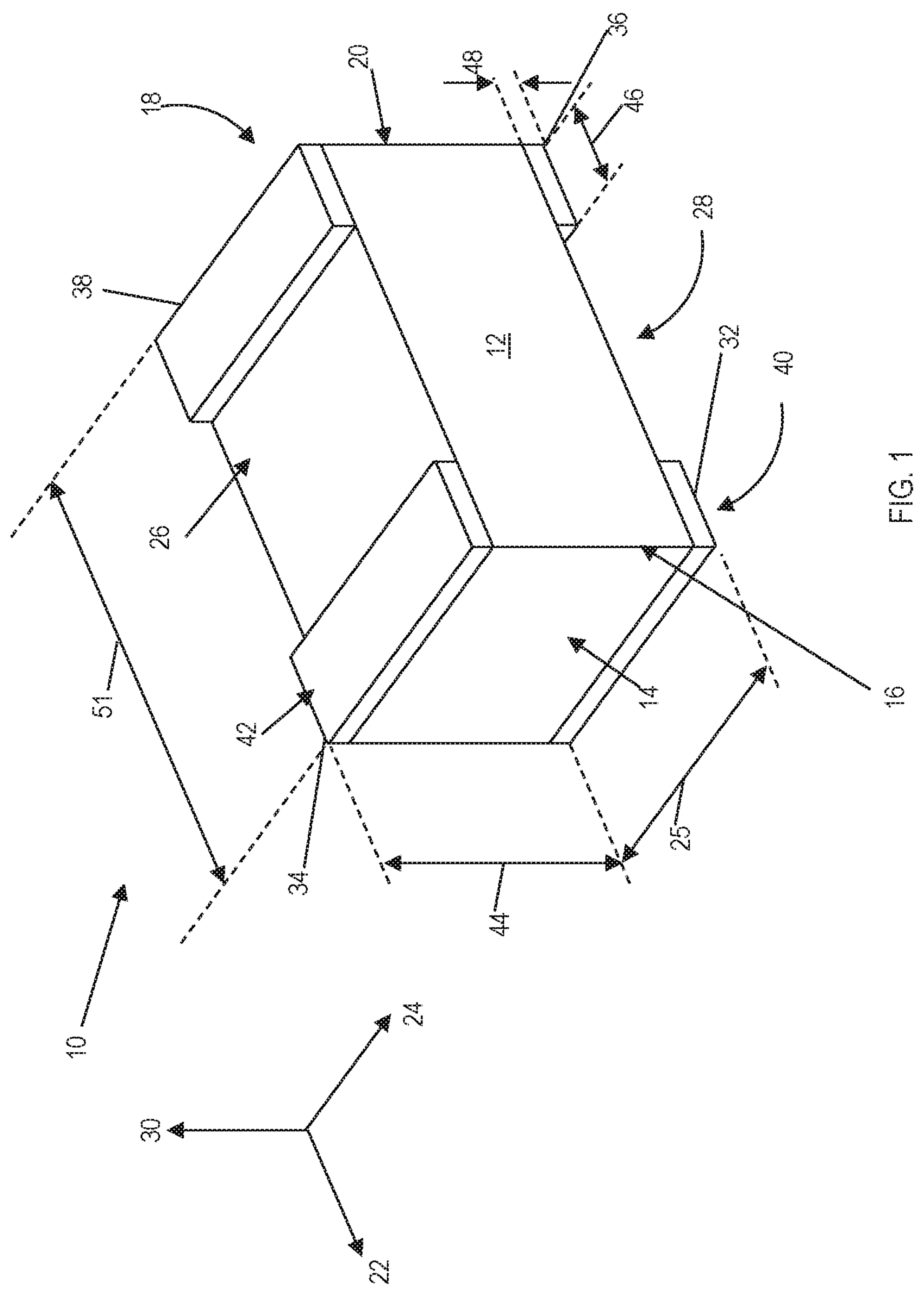
FIG. 1 is a perspective view of one embodiment of a thermal connector in accordance with aspects of the present invention.

Repeat use of reference characters in the present specification and drawing is intended to represent same or analogous features or elements of the invention.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present invention, which broader aspects are embodied in the exemplary construction.

Generally speaking, the present invention is directed to a thermal connector which may be connected between an electrical component and a heat sink, or other thermal point, to improve heat dissipation from the electrical component to the heat sink. The thermal connector may have one or more terminals at each end to aid with connection to the heat sink and electrical component. The terminals may be electrically separate and the beam may have a high electrical resistance such that a flow of electrical current between the terminals may be prevented or substantially prevented. This configuration may be advantageous because it may dissipate heat from the electrical component to the heat sink without electrically connecting the component to the heat sink, which might disrupt the operation of the component.

I. Thermal Connector with Non-Wrapped Terminals

Referring to FIG. 1, the thermal connector 10 may include an electrically insulating beam 12 having a first end face 14 at a first end 16 and a second end face 18 at a second end 20. The second end face 18 may be opposite the first end face 14 in an X direction 22. In some embodiments, the first end face 14 may be parallel with the second end face 18. The beam 12 may have a width in a Y direction 24 which is perpendicular to the X direction 22. In some embodiments, the width of the beam 12 may be equal to an overall width 25 of the thermal connector 10. The beam 12 may also have a top face 26 and a bottom face 28. The bottom face 28 may be offset from the top face 26 in a Z direction 30, which is perpendicular to each of the X and Y directions 22, 24. In some embodiments, the top and bottom faces 26, 28 of the beam 12 may be parallel. The thermal connector 10 may include a first terminal 32 attached to the bottom face 28 of the beam 12 and adjacent the first end 16. The thermal connector 10 may include a second terminal 34 attached to the top face 26 and adjacent the first end 16 of the beam 12.

Still referring to FIG. 1, in some embodiments, the thermal connector 10 may have four terminals. For example, in addition to the first and second terminals 32, 34, discussed above, the thermal connector 10 may include a third terminal 36 attached to the bottom face 28 of the beam 12 and adjacent the second end 20. The thermal connector 10 may also include a fourth terminal 38 attached to the top face 26 and adjacent the second end 20.

Each terminal may extend to a respective edge adjacent a respective end face. For example, the first terminal 32 may extend on the bottom face 28 of the beam 12 along an edge between the bottom face 28 of the beam 12 and the first end face 14 of the beam 12. The second terminal 34 may extend on the top face 26 of the beam 12 along an edge between the top face 26 and first end face 14 of the beam 12. Similarly, the third terminal 36 may extend on the bottom face 28 of the beam 12 along an edge between the second end face 18 and the bottom face 28 of the beam 12. Lastly, the fourth terminal 38 may extend on the top face 26 of the beam 12 along an edge between the top face 26 and the second end face 18 of the beam 12.

The first terminal 32 may have a bottom surface 40 parallel with the bottom face 28 of the beam 12, and the second terminal 34 may have a top surface 42 parallel with the top face 26 of the beam 12. An overall thickness 44 of the connector may be defined as a distance between the bottom surface 40 of the first terminal 32 and the top surface 42 of the second terminal 34 in the Z direction 30, for example. In some embodiments, however, the thermal connector 10 may not include the second and/or fourth terminals 34, 38 on the top face 26 of the beam 12. In such an embodiment, the overall thickness 44 may be defined as the distance between the bottom surface 40 of the first terminal 32 and the top face 26 of the beam 12 in the Z direction 30.

Each of the terminals may have a respective terminal length 46 in the X direction 22 and a respective terminal thickness 48 in the Z direction 30 (labeled in FIG. 1 for the third terminal 36 only for clarity). The overall thickness 44 of the thermal connector 10 in the Z direction 30 may include the respective thicknesses of the terminals in the Z direction 30.

In some embodiments, the thermal connector 10 may have an overall length 51 in the Y direction 24. The overall length 51 and overall width 25 of the thermal connector 10 may be equal to the length and width, respectively, of the beam 12, as illustrated in FIG. 1. For example, the terminals may not extend beyond the edges of the top and bottom faces 26, 28. In other embodiments, however, one or more of the terminals may extend beyond the respective edges of the top and/or bottom face 26, 28 of the beam 12. In that case, the overall length 51 and/or overall width 25 of the thermal connector 10 may be larger than the respective length and and/or width of the beam 12. This may advantageously provide a larger terminal to connect an electrical component and/or heat sink to the thermal connector 10.

II. Thermal Connector with Wrapped Terminals

Figure 2:
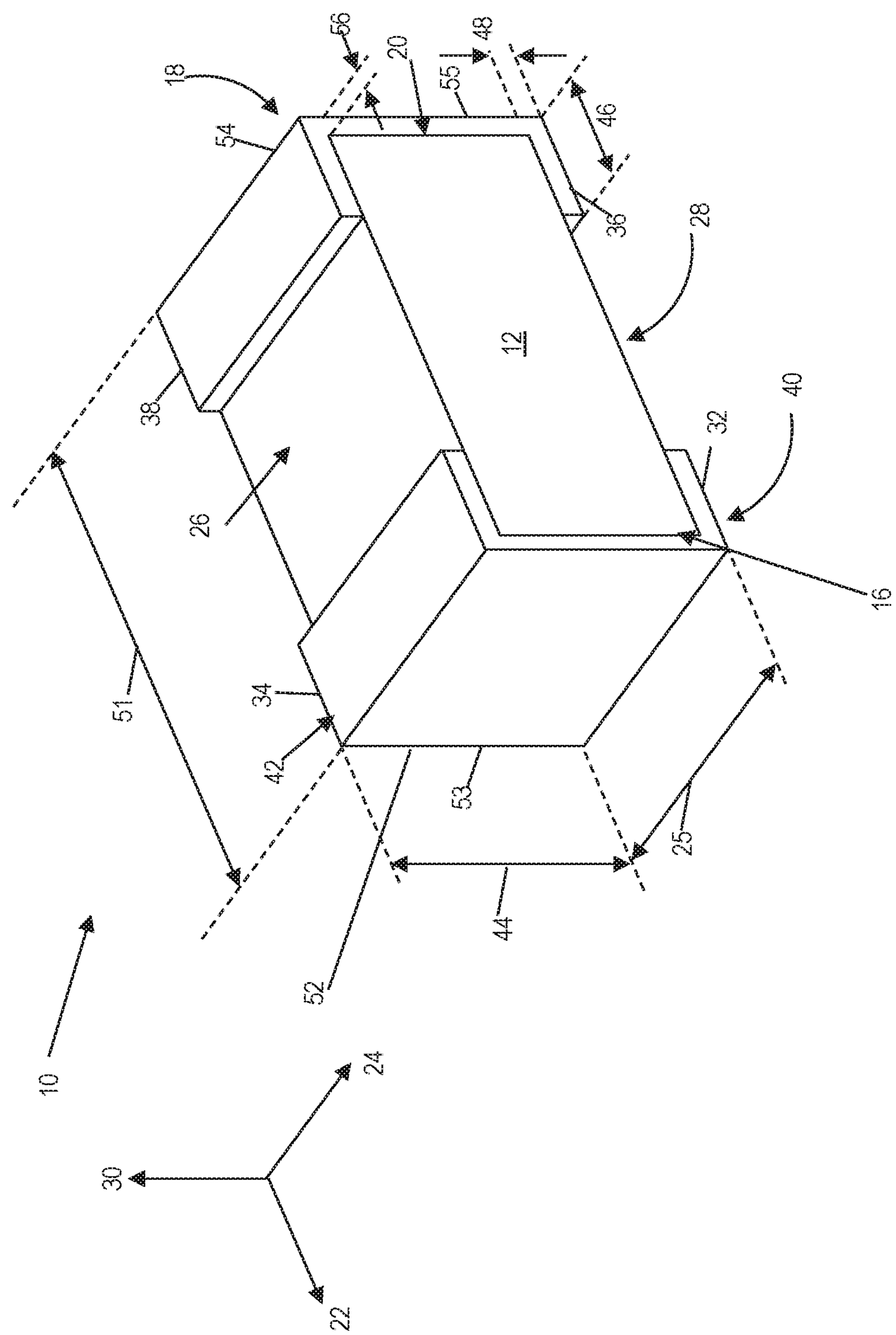
FIG. 2 is a perspective view of another embodiment of the thermal connector in accordance with aspects of the present invention.

Referring to FIG. 2, in some embodiments, the thermal connector 10 may include a first wrap-around terminal 52 which wraps, or extends, around the first end 16 of the beam 12 such that the first wrap-around terminal 52 is attached to both the top face 26 of the beam 12 and the bottom face 28 of the beam 12. The first wrap-around terminal 52 may include a first terminal 32 and a second terminal 34, similar to the previous embodiment, and may also include a first end face terminal 53. The first end face terminal 53 may connect the first terminal 32 with the second terminal 34 and may be attached to the first end face 14 (shown in FIG. 1) of the beam 12. In one embodiment, the first wrap-around terminal 52 may be a single continuous terminal. For example, the first terminal 32, second terminal 34, and the first end face terminal 53 may be portions of the first wrap-around terminal 52. Additionally, the first wrap-around terminal 52 may be formed using any suitable technique, and may be formed in a single step, for example.

A second wrap-around terminal 54 may be similarly configured such that the second wrap-around terminal 54 wraps around the second end 20 of the beam 12 and is attached to both the top face 26 of the beam 12 and the bottom face 28 of the beam 12. For example, the second wrap-around terminal 54 may include a third terminal 36 and a fourth terminal 38, similar to the previous embodiment, and may additionally include a second end face terminal 55. The second end face terminal 55 may be attached to the second end face 18 (shown in FIG. 1) of the beam 12 and may connect the third terminal 36 with the fourth terminal 38. In one embodiment, the second wrap-around terminal 54 may be a single continuous terminal. For example, the third terminal 36, fourth terminal 38, and the second end face terminal 55 may be portions of the second wrap-around terminal 54. Additionally, the second wrap-around terminal 54 may be formed using any suitable technique, and may be formed in a single step, for example.

In some embodiments, the first wrap-around terminal 52 may span the width of the beam 12 across the first end face 14 of the beam 12 such that the width of the beam 12 is equivalent to the overall width 25 of the connector 10. The second wrap-around terminal 54 may similarly span the width of the beam 12 across the second end face 18 of the beam 12. For example, the first wrap-around terminal 52 may have a top surface 42 which is adjacent and/or parallel with the top face 26 of the beam 12. The first wrap-around terminal 52 may also have a bottom surface 40 which is adjacent and/or parallel with the bottom face 28 of the beam 12. The overall thickness 44 of the connector 10 may be defined as the distance in the Z direction 30 between the top surface 42 of the first wrap-around terminal 52 and the bottom surface 40 of the first wrap-around terminal.

Each of the terminals may have a respective terminal length 46 in the X direction 22 and terminal thickness 48 in the Z direction 30 (labeled only on the second wrap-around terminal 54 for clarity). In some embodiments, the portion of the first wrap-around terminal 52 attached to the top surface 42 may have a different length than the portion of the first wrap-around terminal 52 attached to the bottom face 28. In other embodiments, these lengths may be the same or similar as illustrated in FIG. 2.

The first and second wrap-around terminals 52, 54 may also have respective terminal thicknesses 56 in the X direction 22 along the first and second end faces 14, 18 of the beam 12 direction (labeled on the second terminal 54 only for clarity). In some embodiments, the terminal thickness 56 in the X direction 22 of the second wrap-around terminal 54 may be approximately equal to the terminal thickness 48 in the Z direction 30 of the second wrap-around terminal 54 such that the second wrap-around terminal 54 has a uniform thickness. In some embodiments, the first wrap-around terminal 52 may be similarly configured. In other embodiments, the terminal thickness 48 in the Z direction 30 may be different than the terminal thickness 56 in the X direction 22, for example.

Referring to FIG. 2, the overall length 51 of the thermal connector 10 may include each respective terminal thickness 56 in the X direction 22 of the first and second wrap-around terminals 52, 54. The thermal connector 10 may also have an overall width 25 in the X direction 22. In some embodiments, the overall width 25 of the thermal connector 10 may be equal to the width of the beam 12 because the respective widths of first and second wrap-around terminals 52, 54 may be equal to or less than the width of the beam 12. In other embodiments, however, the first and second wrap-around terminals 52, 54 may have respective widths greater than the width of the beam 12 such that at least one of first or second wrap-around terminals 52, 54 extend beyond an edge of the beam 12 in the Y direction 24. This may provide a larger terminal to connect the electrical component 60 and/or heat sink 62 to the thermal connector 10.

III. Dimensions, Properties, and Materials

As noted above, the overall thickness 44 of the thermal connector 10 in the Z direction 30 may include the thicknesses 48 of the first and second terminals 32, 34 in the Z direction 30. In some embodiments, the overall thickness 44 of the thermal connector 10 may be greater than 0.05 inch (1.27 mm) and less than 0.15 inch (3.81 mm). For example, in some embodiments, the overall thickness 44 may be between about 0.055 inch (1.40 mm) and about 0.1 inch (2.54 mm), in other embodiments between about 0.055 inch (1.40 mm) and about 0.085 inch (2.16 mm), in other embodiments between about 0.056 inch (1.42 mm) and about 0.07 inch (1.78 mm), in other embodiments between about 0.057 inch (1.45 mm) and about 0.063 inch (1.60 mm). In some embodiments, the overall thickness 44 may be about 0.06 inch (1.52 mm) or greater. For instance, the thickness may be between about 0.06 inch (1.52 mm) and about 0.14 inch (3.556 mm), in other embodiments, between about 0.07 (1.78 mm) inch and about 0.13 inch (3.30 mm), in other embodiments, between about 0.08 inch (2.03 mm) and about 0.12 inch (3.05 mm), in other embodiments, between about 0.09 inch (2.29 mm) and about 0.11 inch (2.79 mm), and, in other embodiments, between about 0.1 inch (2.54 mm) and about 0.15 inch (3.81 mm).

In some embodiments, the overall length 51 of the thermal connector 10 may be between about 0.1 inch (2.54 mm) and about 0.5 inch (1.27 mm), and in some embodiments, between about 0.15 inch (3.81 mm) and about 0.25 inch (6.35 mm), and in some embodiments, between about 0.2 inch (5.08 mm) and about 0.4 inch (10.16 mm), and in some embodiments, between about 0.25 inch (6.35 mm) and about 0.45 inch (11.43 mm), and in some embodiments, between about 0.3 inch (7.62 mm) and about 0.4 inch (10.16 mm), and in some embodiments, between about 0.35 inch (8.89 mm) and 0.38 inch (9.65 mm).

In some embodiments, the overall width 25 of the thermal connector 10 may be between about 0.05 inch (0.25 mm) and about 0.4 inch (10.16 mm), and in some embodiments between about 0.02 inch (0.51 mm) about 0.4 inch (10.16 mm), and in some embodiments between about 0.08 inch (2.03 mm) and about 0.3 inch (7.62 mm), and in some embodiments between about 0.08 inch (2.03 mm) and about 0.1 inch (2.54 mm), and in some embodiments between about 0.2 inch (5.08 mm) and about 0.3 inch (7.62 mm), and in some embodiments between about 0.3 inch (7.62 mm) and about 0.4 inch (10.16 mm).

In some embodiments, the overall length 51 of the thermal connector 10 may be between about 1 and about 6 times greater than the overall thickness 44 of the thermal connector 10, in some embodiments, between about 2 and about 6 times greater than the overall thickness 44 of the thermal connector 10, and, in some embodiments, between about 2 and about 3.5 times greater than the overall thickness 44 of the thermal connector 10.

In other embodiments, the overall length 51 of the thermal connector 10 may be between about 3.2 and about 4.9 times greater than the overall thickness 44 of the thermal connector 10, and in some embodiments between about 3.5 and about 4.5 times greater than the overall thickness 44 of the thermal connector 10, and in some embodiments between about 3.8 and about 4.2 times greater than the overall thickness 44 of the thermal connector 10. In other embodiments, the overall length 51 of the thermal connector 10 may be between 5 and 6.2 times greater than the overall thickness 44 of the thermal connector 10, and in some embodiments between about 5.5 and 6.2 times greater than the overall thickness 44 of the thermal connector 10, and in some embodiments between about 6.0 and 6.2 times greater than the overall thickness 44 of the thermal connector 10.

In some embodiments, each of the overall length 51 and the overall width 25 of the thermal connector 10 may be between about 0.35 inch (8.89 mm) and about 0.4 inch (10.16 mm). For example, in some embodiments, each of the overall length 51 and the overall width 25 of the thermal connector 10 may be between about 0.36 inch (9.14 mm) and about 0.38 inch (9.65 mm).

In some embodiments, the thermal resistance across the overall length 51 of the thermal connector 10 may be between about 2° C./W and about 10° C./W at about 22° C., and in some embodiments between 3° C./W and about 7° C./W at about 22° C. For the embodiment depicted in FIG. 1, the thermal resistance may be associated with a heat flow between the first and third terminals 32, 36, for example. For the embodiment depicted in FIG. 2, the thermal resistance may be associated with a heat flow between the first and second terminals 32, 34, for example.

In some embodiments, the thermal connector 10 may have an aspect ratio between the overall length 51 and the overall width 25 calculated as the length divided by the width. A "thermal aspect resistance" parameter may be defined as the ratio of the aspect ratio to the thermal resistance of the thermal connector 10 across the length of the thermal connector 10 (e.g., between the first and third terminals 32, 36 for the embodiment of the thermal connector 10 depicted in FIG. 1). The "thermal aspect resistance" parameter may be defined as the thermal resistance divided by the aspect ratio. The "thermal aspect resistance" parameter value may be indicative of the effectiveness of the thermal connector 10 based on its size. For example, a low "thermal aspect resistance" may indicate that the thermal connector 10 not only has a low thermal resistance across the length of the thermal connector 10 but also that the thermal connector 10 has a reasonably high aspect ratio, such that it may span a reasonable length compared to its width. In some embodiments, the "thermal aspect resistance" parameter may be between about 2.2 C/W and about 4.3 C/W at about 22° C. In some embodiments, the "thermal aspect resistance" parameter may be between about 2.2 C/W and about 3.0 C/W at about 22° C. In some embodiments the "thermal aspect resistance" parameter may be between about 2.5° C./W and about 4.1° C./W at about 22° C. In some embodiments the "thermal aspect resistance" parameter may be between about 2.5 C/W and about 3.2° C./W at about 22° C. In some embodiments the "thermal aspect resistance" parameter may be between about 3.9° C./W and about 4.3° C./W at about 22° C.

As is known in the art, thermal resistivity and thermal conductivity of a material are inversely related. Thus, a low thermal resistivity correlates with a high thermal conductivity. In some embodiments, the electrically insulating beam 12 may be made from any suitable material having a generally low thermal resistivity (e.g., less than about $6.67 \times 10^{-3}$ m·° C./W), and a generally high electrical resistivity (e.g., greater than about $10^{14}$ Ω·cm). A thermal resistivity of $6.67 \times 10^{-3}$ m·° C./W is equivalent with a thermal conductivity of about 150 W/m·° C. In other words, suitable materials for the beam 12 may have a generally high thermal conductivity, such as greater than about 150 W/m·° C.

For example, in some embodiments, the electrically insulating beam 12 may be made from a material having a thermal conductivity between about 100 W/m·° C. and about 300 W/m·° C. at about 22° C. In other embodiments, the electrically insulating beam 12 may be made from a material having a thermal conductivity between about 125 W/m·° C. and about 250 W/m·° C. at about 22° C. In other embodiments, the electrically insulating beam 12 may be made from a material having a thermal conductivity between about 150 W/m·° C. and about 200 W/m·° C. at about 22° C.

In some embodiments, the beam 12 may comprise aluminum nitride, beryllium oxide, aluminum oxide, boron nitride, silicon nitride, magnesium oxide, zinc oxide, silicon carbide, any suitable ceramic material, and mixtures thereof.

In some embodiments, the electrically insulating beam 12 may comprise aluminum nitride. For example, in some embodiments the electrically insulating beam 12 may be made from any suitable composition including aluminum nitride. In some embodiments, the beam 12 may be made primarily from aluminum nitride. For example, the beam 12 may contain additives or impurities. In other embodiments, the electrically insulating beam 12 comprises beryllium oxide. For example, in some embodiments the electrically insulating beam 12 may be made from any suitable composition including beryllium oxide. In some embodiments, the beam 12 may be made primarily from beryllium oxide. For example, the beam 12 may contain additives or impurities.

In some embodiments, the terminals may include an outer layer over a substrate. The substrate may be magnetic in some embodiments, and non-magnetic in other embodiments. The outer layer may be formed from any suitable material, including, for example, corrosion-resistant materials. For example, in some embodiments, the terminals may comprise an outer layer of gold, silver, platinum, nickel, and/or a mixture or compound thereof. For example, in one embodiment, at least one of the first terminal 32 or the second terminal 34 may comprise gold. In some embodiments, at least one of the first terminal 32 or the second terminal 34 may comprise a magnetic material. In some embodiments, the magnetic material may be a substrate and the outer layer may be disposed over the magnetic material. For example, in one embodiment, one or more of the terminals may include an outer layer of gold disposed over a magnetic substrate, such as a magnetic or magnetized metal. In some embodiments, the substrate may comprise a metal such as copper or steel. In another embodiment, one of more of the terminals may include an outer layer, such as gold, disposed over a non-magnetic substrate, such as a ceramic, for example. In other embodiments, the outer layer may be gold, silver, platinum, nickel, copper, steel, and/or any other suitable material. Similarly, in other embodiments, the substrate may be gold, silver, platinum, nickel, copper, steel, and/or any other suitable material. Moreover, in some embodiments, the terminals may not include an outer layer.

In some embodiments, the thermal connector 10 may have a relatively low capacitance value. This may advantageously prevent substantial interference with electric fields, such as radio waves. For example, the thermal connector 10 may result in substantially no interference with the performance of electrical components to which the thermal connector 10 is connected, such as radio frequency amplifiers. For example, in some embodiments, the capacitance of the thermal connector 10 may be 0.2 pF or less. In some embodiments, the capacitance of the thermal connector 10 may be 0.15 pF or less. In some embodiments, the capacitance of the thermal connector 10 may be 0.13 pF or less. In some embodiments, the capacitance of the thermal connector 10 may be 0.10 pF or less. In some embodiments, the capacitance of the thermal connector 10 may be 0.08 pF or less. In some embodiments the capacitance of the thermal connector 10 may be 0.01 pF or greater. In some embodiments the capacitance of the thermal connector 10 may be 0.001 pF or greater.

The thermal connectors 10 may be manufactured or fabricated using any suitable technique. For example, the beam 12 may be cut from a substrate or wafer, and the terminals may then be formed on each beam 12. Alternatively, the terminals may be formed on a plate-shaped material and then the plate-shaped material may cut into the thermals connectors 10. The terminals may be formed using any suitable process, including, for example, chemical or vapor deposition on the beam 12. Alternatively, in some embodiments, the terminals may be formed by dipping the ends of the beam 12 in a liquid form of the terminal material and then allowing the terminal material to harden. The terminals may then be additionally shaped or finished using any suitable method, including for example, grinding or sanding. In some embodiments, the above process may be repeated to produce terminals having multiple layers, e.g., a gold plating over a magnetic or non-magnetic layer.

IV. Connections

Figure 3:
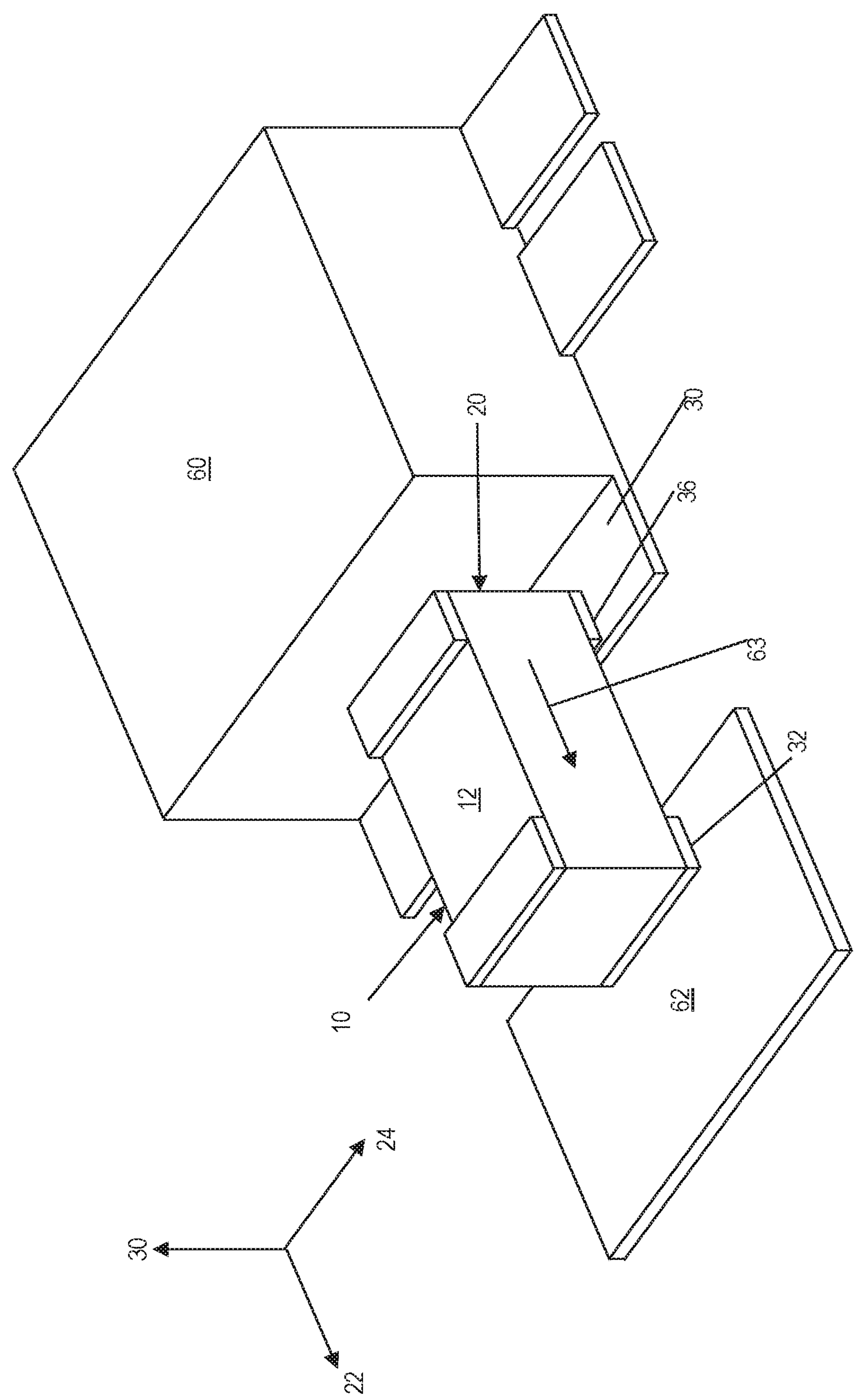
FIG. 3 is a perspective view of the embodiment of the thermal connector illustrated in FIG. 1 connecting an electronic device with a heat sink.

Referring to FIG. 3, in one embodiment, the thermal connector 10 may be directly connected between an electrical component 60 and a heat sink 62, or any other suitable component. For example, the third terminal 36 of the thermal connector 10 may be connected with an attachment tab 64 of the electrical component, and the first terminal 32 may be connected with the heat sink 62. Heat may flow from the attachment tab 64 of the electrical component 60, through the third terminal 36, through the beam 12, and out through the first terminal 32 to the heat sink 62 (as illustrated by the arrow 63).

In other embodiments, multiple thermal conductors may be connected in parallel or series to a single electrical component. For example, multiple thermal conductors may be connected in series, in an end-to-end configuration, to span a distance greater than the length of a single thermal conductor. Multiple thermal conductors may also be connected in parallel between a single electrical component and the heat sink, for example. In other embodiments, multiple heat sinks may be connected using multiple thermal connectors 10 to the electrical component.

Lastly, in some embodiments, the thermal connector 10 may connect a first electrical component with a second electrical component which may act as a heat sink. For example the second electrical component, while not itself a heat sink, may be connected with a heat sink such that heat may flow from the first electrical component, through the second electrical component, and into the heat sink. One of ordinary skill in the art would understand that still other configurations are possible based on the above disclosure.

Figure 4:
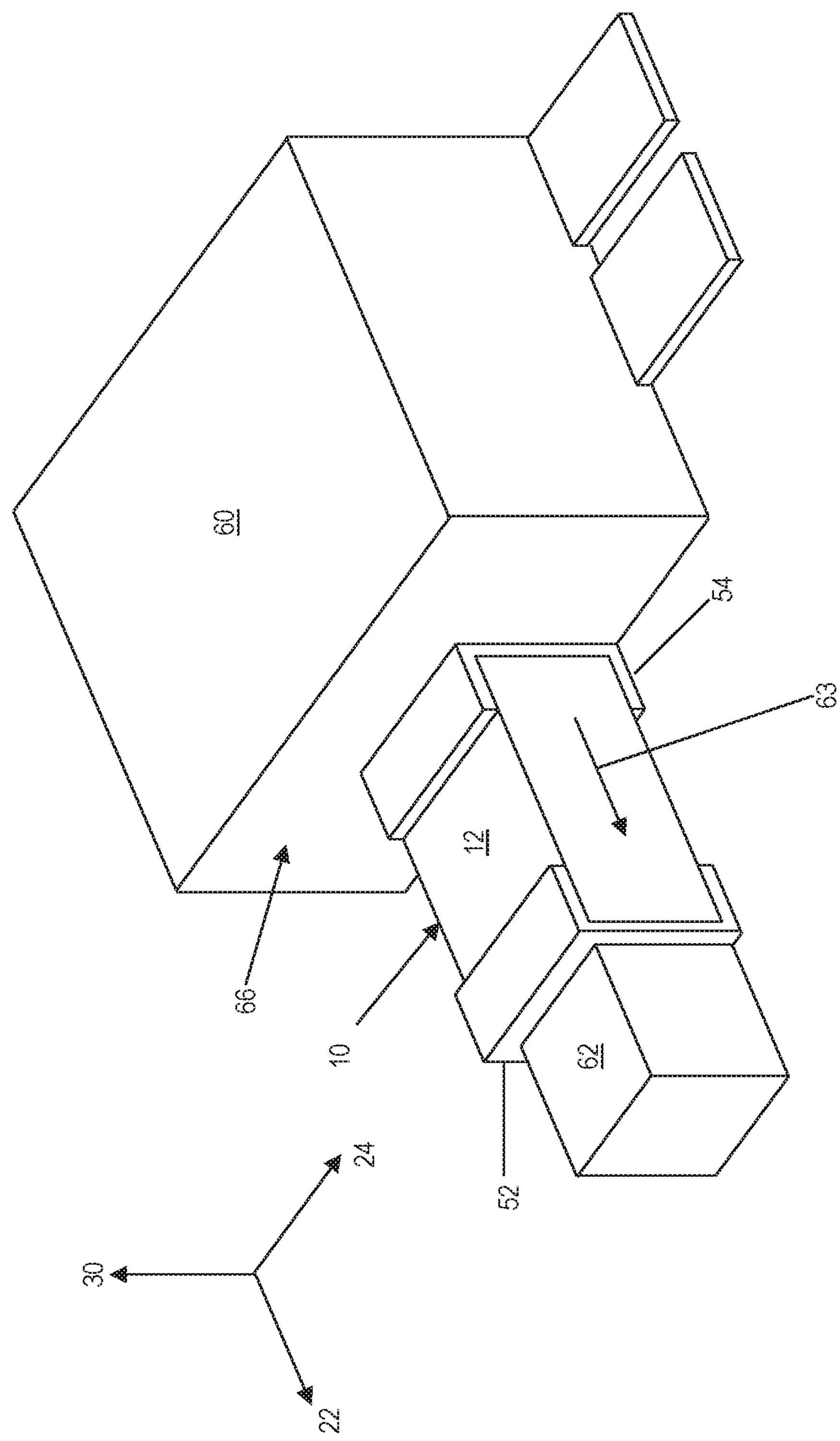
FIG. 4 is a perspective view of the embodiment of the thermal connector illustrated in FIG. 2 connecting an electronic device with a heat sink.

In some embodiments, the thermal connector 10 may be coupled directly to the electrical component, which may be particularly advantageous for electrical components lacking a suitable attachment tab 64. For example, the thermal connector 10 may directly thermally connect an electrical component 60 with the heat sink 62 as illustrated in FIG. 4. The thermal connector 10 illustrated in FIG. 4 has wrap-around terminals as illustrated in FIG. 2. The portion of the second wrap-around terminal 54 of the thermal connector 10 that extends over the second end 20 of the beam 12 may be directly attached to an exterior face 66 of the electrical component. Similarly, a portion of the first wrap-around terminal 52 that extends over the first end 16 of the beam 12 may be attached to a face of the heat sink 62. This configuration may advantageously provide a greater contact surface with at least one of the electrical component 60 or the heat sink 62.

Figure 5:
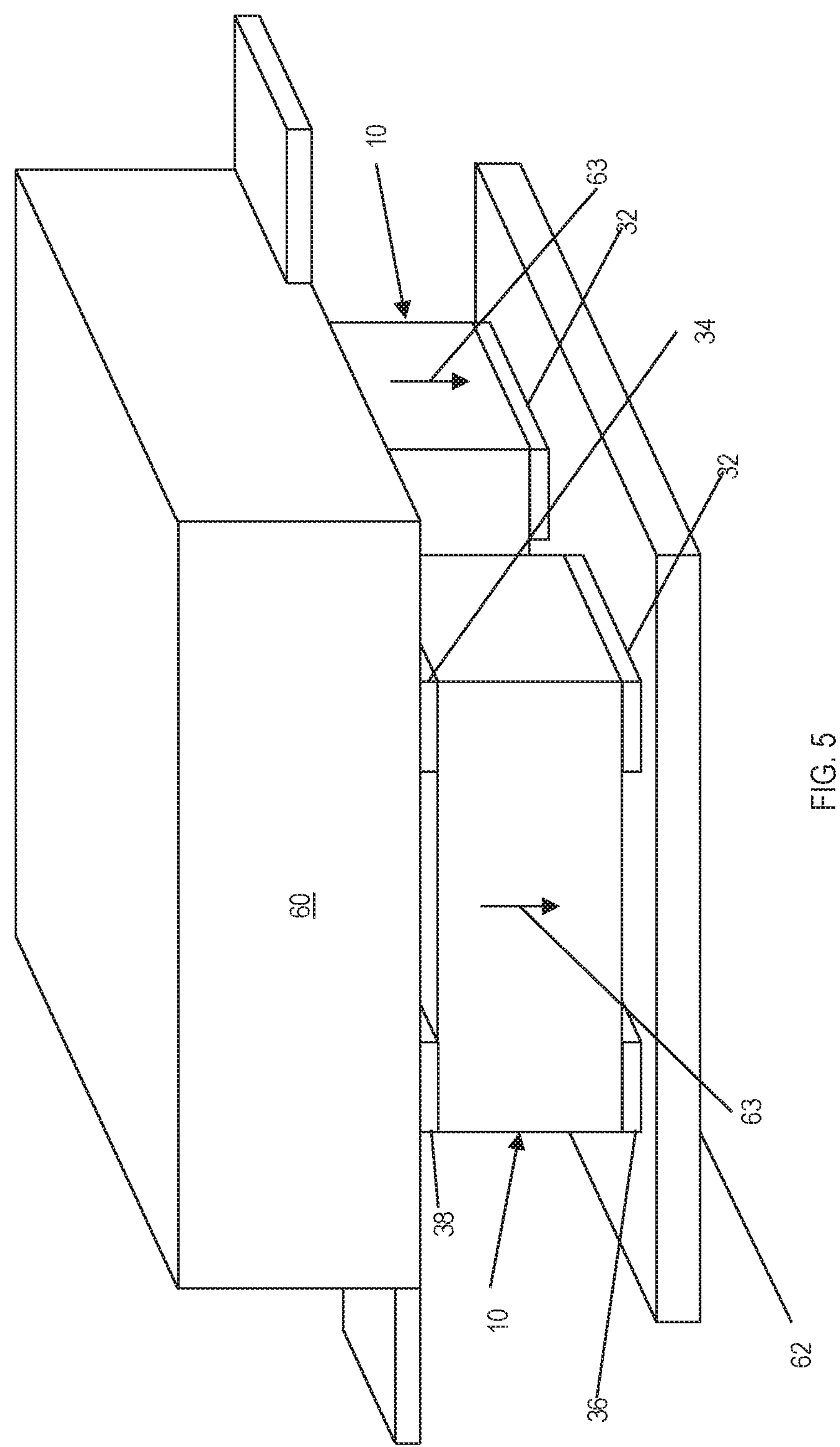
FIG. 5 is a perspective view of the embodiment of the thermal connector illustrated in FIG. 1 connecting an electronic device with a heat sink.

Referring to FIG. 5, in one embodiment, the electrical component 60 may be stacked on top of one or more thermal connectors 10 such that the second and fourth terminals 34, 38 are attached to the electrical component 60 and the first and third terminals 32, 36 are attached to the heat sink 62. Heat may flow (as illustrated by arrow 63) from the second and fourth terminals through the beam 12 and out through the first and third terminals 32, 36 to the heat sink 62.

The connections between the terminals and the electrical component 60 and/or heat sink 62 may be formed using any suitable method, such as soldering, for example. For example, the thermal connector 10 may be connected using an interconnect that attaches to or connects the respective terminals of the thermal connector 10. The interconnect may be made of a conductive material, such as a conductive metal. In one embodiment, the interconnect may be relatively flat or may be one having an increased surface area. Regarding the latter, the interconnect may have projections/protrusions or may also be formed from wires, braids, coils, etc. In this regard, the specific dimensions and configuration of the interconnects is not necessarily limited. Regardless of its form, any of a variety of different conductive materials may be employed, such as copper, tin, nickel, aluminum, etc., as well as alloys and/or coated metals. If desired, the conductive material may optionally be insulated with a sheath material.

V. Electrical Tuning

In some embodiments, the thermal connectors 10 may include features that provide electrical tuning with the circuit and/or component to which the thermal connector 10 is connected. Such features can alter the radiofrequency and/or microwave frequency response and/or characteristics of the thermal connector, for example to provide impedance matching.

Figure 6A:
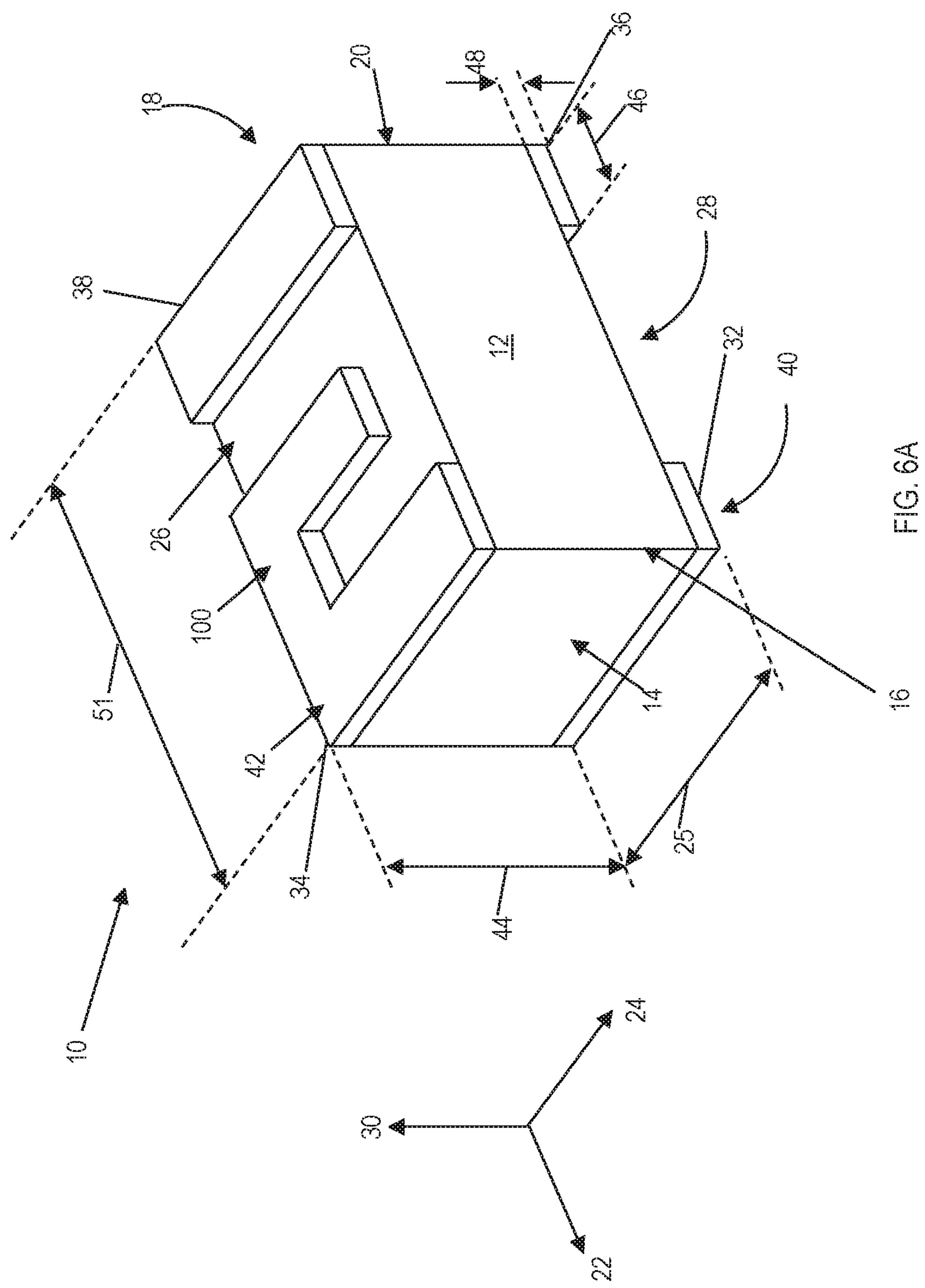
FIG. 6A is a perspective view of an embodiment of the thermal connector that includes conductive traces configured to provide electrical tuning.

Referring to FIG. 6A, one or more conductive trace(s) 100 may be formed on the top surface 26 of the thermal connector 10. The conductive trace(s) 100 may be formed from any suitable material and may have one or more layers, for example as described above with reference to the terminal materials and layer. For example, the conductive trace(s) 100 may include gold, silver, platinum, nickel, copper, steel, and/or any other suitable material.

The trace(s) 100 may be electrically connected (or integrally formed) with the second terminal 34. The trace(s) 100 may generally have an "L" shape that extends towards the fourth terminal 38. The size and dimensions of the trace(s) 100 may be selected to provide the desired electrical tuning effects.

Figure 6B:
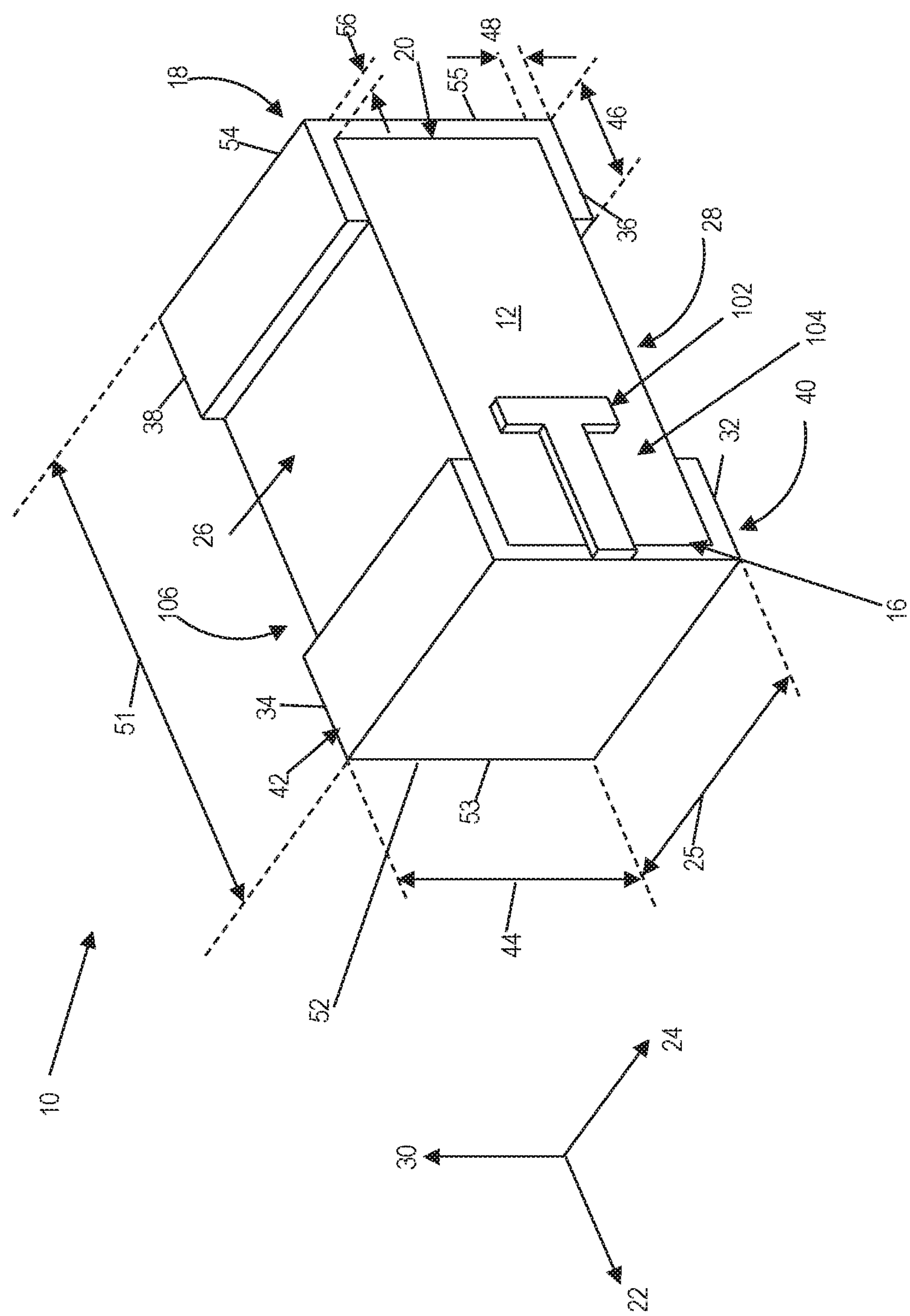
FIG. 6B is a perspective view of another embodiment of the thermal connector that includes conductive traces configured to provide electrical tuning.

Referring to FIG. 6B, another embodiment of the thermal connector 10 is illustrated that includes a conductive trace 102 that is configured to provide electrical tuning (e.g., impedance matching). The conductive trace 102 may be formed on a side surface 104 of the thermal connector 10. A second side surface 106 may be parallel and opposite the side surface 104. The size and dimensions of the trace(s) 102 may be selected to provide the desired electrical tuning effects.

It should be understood that conductive trace(s) may be formed on any of the surfaces (e.g., bottom surface 40, top surface 42, first end face 14, second end face 18, and/or one or both of the side surfaces 104, 106) of the thermal connector 10. Furthermore, the trace(s) may be electrically connected with any of the terminals (e.g., first terminal 32, second terminal 34, third terminal 36, and/or fourth terminal 38) of the thermal connector 10. However, the conductive traces generally are not connected in a way that would facilitate electrical flow between the heat source and heat sink. In addition, the conductive traces may be physically located between two or more of the terminals 32, 34, 36, 38.

The number, size, and shape of such traces can be selected to provide one or more desired electrical tuning characteristics (e.g., impedance, resonance frequency, insertion loss, return loss, etc.). As such, the traces may have a variety of suitable shapes and geometries that can be selected to electrically tune the thermal connector 10. As examples, the trace(s) may have an "L" or "T" shape. Similarly, the number of traces can vary, for example between 1 and 10, or more.

Figure 7:
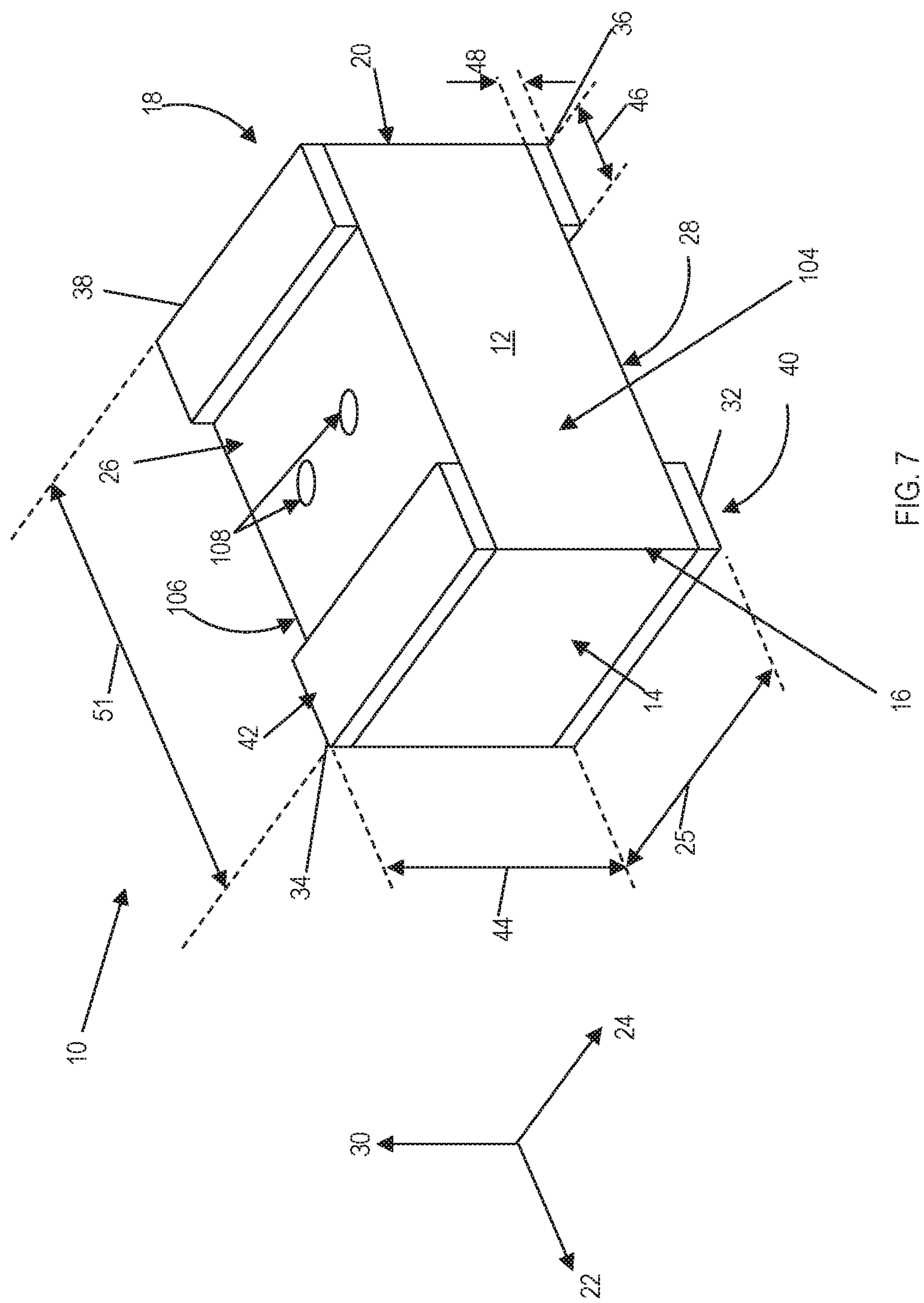
FIG. 7 is a perspective view of an embodiment of the thermal connector having holes formed therein to provide electrical tuning.

Referring to FIG. 7, in some embodiments, one or more holes 108 may be formed in the beam 12 and/or terminals (e.g., first terminal 32, second terminal 34, third terminal 36, and/or fourth terminal 38) of the thermal connector 10 to electrically tune the thermal connector 10. Such holes 108 may be formed using a variety of suitable techniques, including laser drilling. A size and/or number of such holes 108 may be selected to electrically tune the thermal connector 10, for example, to provide impedance matching. Referring to FIG. 7, a pair of holes 108 may extend from the top face 26 to the bottom face 28 of the thermal connector 10. In other embodiments, holes may extend between side surfaces 102, 104 or between end faces 14, 20. Additionally, any suitable number of holes may be provided, including, for example from 1 to 10, or more.

VI. Applications

The various embodiments of thermal connectors 10 disclosed herein may be connected between any suitable heat source and sink. For example, the thermal connector 10 may be connected to a heat source, such as a terminal pad or conductive trace, and connected to a grounded cover or thermal via. The thermal via may be formed in a layer of a printed circuit board and may connect with a heat sink. For instance, the thermal connector 10 may be connected with the thermal via on a first surface of the layer, and the thermal via may extend through the layer to connect with a heat sink that is located on a second surface that is opposite the first surface.

The thermal connector 10 may also be connected between terminals of a transistor (e.g., MOSFET). For example, the thermal connector 10 may be connected between gate and ground terminals. As another example, the thermal connector 10 may be connected between source and ground terminals.

Figure 8:
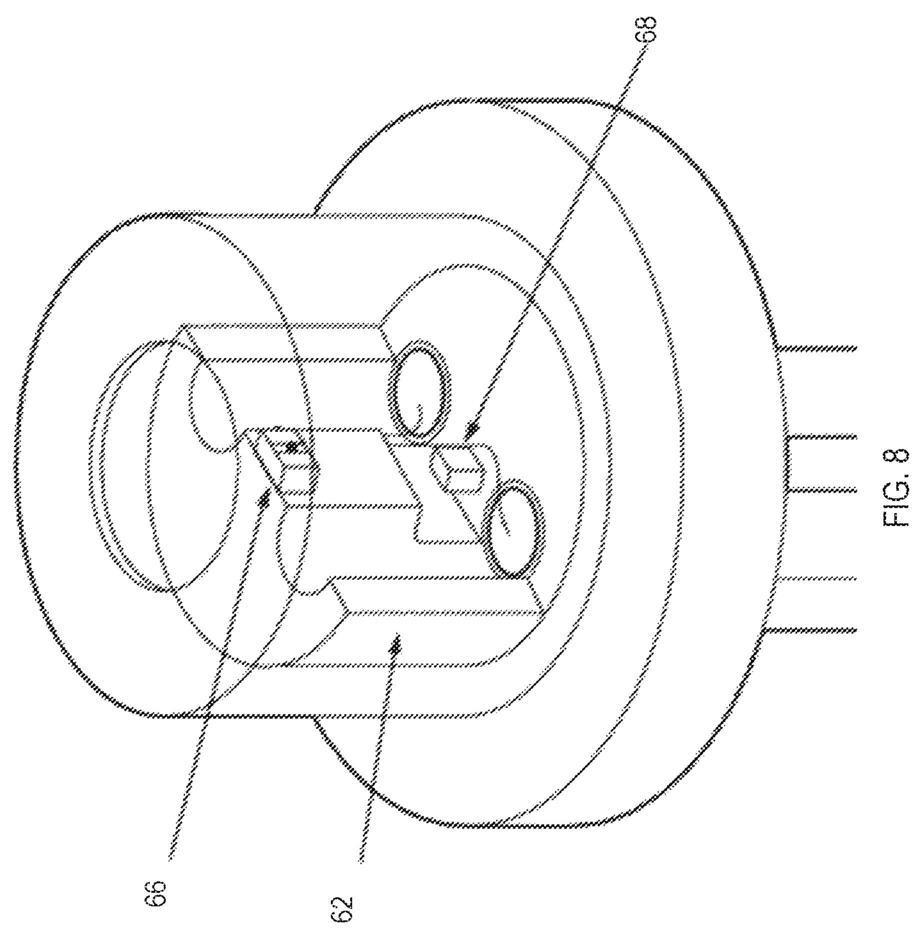
FIG. 8 is a perspective view of an example of an electrical component, a laser diode.

The various embodiments of thermal connectors 10 disclosed herein may find application with any suitable electrical component, such as a power amplifier, filter, synthesizer, computer component, power supply, and/or diode, for example. Specific examples of power amplifier types include Gallium Nitride (GaN) power amplifiers, high radio frequency amplifiers, and the like. Examples of diodes which may be suitable for connection with a thermal component, as described herein, may include diodes specifically adapted for use in lasers, among other types of diodes. For example, referring to FIG. 8, in some embodiments, the thermal connector 10 may be used to form or improve a thermal connection between a laser diode 66 and a heat sink 62. In some embodiments, the thermal connector 10 may be used to form or improve a thermal connection between a monitor photodiode 68 and the heat sink 62.

EXAMPLE

The following table shows dimensions and thermal properties for various exemplary embodiments in accordance with aspects of the present invention.

TABLE 1

Examples of Thermal Connector Embodiments

| Case | Length | Width | Thickness | Thermal Resistance (C/W) | | Thermal Conductivity (mW/C) | |
|---|---|---|---|---|---|---|---|
| Size | (in) | (in) | (in) | AlN | BeO | AlN | BeO |
| 2010 | 0.195 | 0.095 | 0.06 | 10 | 6 | 100 | 159 |
| 2525 | 0.24 | 0.25 | 0.06 | 4 | 3 | 240 | 380 |
| 3737 | 0.365 | 0.375 | 0.06 | 4 | 3 | 240 | 380 |
| 3725 | 0.37 | 0.245 | 0.06 | 6 | 4 | 160 | 254 |

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A surface mount thermal connector comprising:

an electrically insulating beam having a first end face at a first end and a second end face at a second end, the second end face opposite the first end face in an X direction, the beam having a width in a Y direction perpendicular to the X direction, the beam having a top face and a bottom face which is offset from the top face in a Z direction, the Z direction being perpendicular to each of the X and Y directions;

a first terminal attached to the bottom face and adjacent the first end;

a second terminal attached to the top face and adjacent the first end; and a conductive trace formed on the electrically insulating beam and configured to provide electrical tuning;

wherein the connector has an overall thickness in the Z direction, including the first and second terminals, which is greater than 1.27 mm and less than 3.81 mm.

2. The surface mount thermal connector of claim 1, wherein the electrically insulating beam comprises a material having a thermal conductivity from about 150 W/m·° C. to about 300 W/m·° C. at about 22° C.

3. The surface mount thermal connector of claim 1, wherein the electrically insulating beam comprises aluminum nitride.

4. The surface mount thermal connector of, wherein the electrically insulating beam comprises beryllium oxide.

5. The surface mount thermal connector of claim 1, further comprising:

a third terminal attached to the bottom face and adjacent the second end; and a fourth terminal attached to the top face and adjacent the second end.

6. The surface mount thermal connector of claim 1, further including a first end face terminal attached to the first end face of the beam and connecting the first terminal with the second terminal.

7. The surface mount thermal connector of claim 1, further including a second end face terminal attached to the second end face of the beam and connecting the third terminal with the fourth terminal.

8. The surface mount thermal connector of claim 1, wherein the first terminal spans the width of the beam across the first end face of the beam.

9. The surface mount thermal connector of claim 1, wherein an overall length of the thermal connector is between about 2.5 mm and about 12.7 mm.

10. The surface mount thermal connector of claim 1, wherein an overall width of the thermal connector is between about 5.1 mm and about 10.2 mm.

11. The surface mount thermal connector of claim 1, wherein the thermal resistance of the thermal connector is between about 2° C./W and about 10° C./W at about 22° C.

12. The surface mount thermal connector of claim 1, wherein the overall thickness is between about 1.4 mm and about 2.16 mm.

13. The surface mount thermal connector of claim 1, wherein the overall thickness is between about 1.45 mm and about 1.6 mm.

14. The surface mount thermal connector of claim 1, wherein the thermal connector has an overall length between 3.2 and 4.9 times the overall thickness of the thermal connector.

15. The surface mount thermal connector of claim 1, wherein the thermal connector has an overall length between 5 and 6.2 times the overall thickness of the thermal connector.

16. The surface mount thermal connector of claim 1, wherein the thermal connector has an overall length in the X direction, and each of the overall length and the overall width of the thermal connector is between about 8.9 mm and about 10.2 mm.

17. The surface mount thermal connector of claim 1, wherein at least one of the first terminal or the second terminal comprises gold.

18. The surface mount thermal connector of claim 1, wherein at least one of the first terminal or the second terminal comprises a magnetized material.

19. The surface mount thermal connector of claim 1, wherein the thermal connector has a thermal aspect resistance parameter between about 2.2° C./W and about 3.0° C./W at about 22° C., and wherein the thermal aspect resistance parameter is a ratio of a thermal resistance of the thermal connector divided by an aspect ratio of the thermal connector, and wherein the aspect ratio is an overall length of the thermal connector divided by an overall width of the thermal connector.

20. The surface mount thermal connector of claim 1, wherein at least one hole is formed in the beam to provide electrical tuning.

21. A surface mount thermal connector comprising:

an electrically insulating beam having a first end face at a first end and a second end face at a second end, the second end face opposite the first end face in an X direction, the beam having a width in a Y direction perpendicular to the X direction, the beam having a top face and a bottom face which is offset from the top face in a Z direction, the Z direction being perpendicular to each of the X and Y directions;

a first terminal attached to the bottom face and adjacent the first end; and a second terminal attached to the top face and adjacent the first end;

wherein the connector has an overall thickness in the Z direction, including the first and second terminals, which is greater than 1.27 mm and less than 3.81 mm, and wherein at least one hole is formed in the electrically insulating beam to provide electrical tuning.

* * * * *